United States Patent
Yu

(10) Patent No.: US 9,426,928 B2
(45) Date of Patent: Aug. 23, 2016

(54) HEAT DISSIPATION PIPE LOOP AND BACKLIGHT MODULE USING SAME

(71) Applicant: Shenzhen China Star Optoelectronics Technology Co., Ltd., Shenzhen, Guangdong (CN)

(72) Inventor: Gang Yu, Guangdong (CN)

(73) Assignee: Shenzhen China Star Optoelectronics Technology Co., Ltd., Shenzhen, Guangdong (CN)

( * ) Notice: Subject to any disclaimer, the term of this patent is extended or adjusted under 35 U.S.C. 154(b) by 261 days.

(21) Appl. No.: 14/235,565

(22) PCT Filed: Jan. 3, 2014

(86) PCT No.: PCT/CN2014/070117
§ 371 (c)(1),
(2) Date: Jan. 28, 2014

(87) PCT Pub. No.: WO2015/089915
PCT Pub. Date: Jun. 25, 2015

(65) Prior Publication Data
US 2015/0305199 A1  Oct. 22, 2015

(30) Foreign Application Priority Data
Dec. 16, 2013 (CN) .......................... 2013 1 0690495

(51) Int. Cl.
*F21V 29/00* (2015.01)
*H05K 7/20* (2006.01)
*H01L 23/427* (2006.01)
(Continued)

(52) U.S. Cl.
CPC ........... *H05K 7/20336* (2013.01); *F21V 29/00* (2013.01); *F28D 15/043* (2013.01);
(Continued)

(58) Field of Classification Search
CPC .. F21V 29/00; G02B 6/0085; H05K 7/20336
See application file for complete search history.

(56) References Cited

U.S. PATENT DOCUMENTS

2004/0104012 A1*  6/2004  Zhou .................... H01L 23/427
                                                     165/104.26
2008/0164010 A1*  7/2008  Kang ................... F28D 15/0266
                                                     165/104.26
(Continued)

FOREIGN PATENT DOCUMENTS

CN      1873360 A    12/2006
CN      1882237 A    12/2006
(Continued)

*Primary Examiner* — Andrew Coughlin
(74) *Attorney, Agent, or Firm* — Andrew C. Cheng

(57) ABSTRACT

The present invention provides a heat dissipation pipe loop and a backlight module using the dissipation pipe loop. The heat dissipation pipe loop includes: an evaporator section (2), a liquid pipe (4) connected to an end of the evaporator section (2), a condenser pipe (6) connected to an end of the liquid pipe (4) distant from the evaporator section (2), and a gas pipe (8) having an end connected to the condenser pipe (6) and an opposite end connected to the evaporator section (2). The evaporator section (2) includes an enclosure (22) and a separation board (24) received in the enclosure (22). The enclosure (22) defines therein a receiving space (246) and the separation board (24) is mounted in the receiving space (246) to divide the receiving space (246) into a liquid chamber (262) and a gas chamber (264). The liquid pipe (4) is in communication with the liquid chamber (262) and the gas pipe (8) is in communication with the gas chamber (264). The separation board (24) separates gas and liquid from each other.

14 Claims, 9 Drawing Sheets

(51) Int. Cl.
*F21V 8/00* (2006.01)
*F28D 15/04* (2006.01)
(52) U.S. Cl.
CPC ........... *G02B6/0085* (2013.01); *G02B 6/0088* (2013.01); *H01L 23/427* (2013.01); *H01L 2924/0002* (2013.01)

(56) References Cited

U.S. PATENT DOCUMENTS

2010/0155019 A1* 6/2010 Zhou .................... F28D 15/043
                                                        165/104.26
2010/0163212 A1* 7/2010 Chin .................... F28D 15/0266
                                                        165/104.26
2012/0229726 A1* 9/2012 Kim ...................... G02F 1/1336
                                                        349/58

FOREIGN PATENT DOCUMENTS

| CN | 101566748 A | 10/2009 |
| CN | 101762194 A | 6/2010 |
| CN | 201935147 U | 8/2011 |
| CN | 102374807 A | 3/2012 |

\* cited by examiner

HEAT DISSIPATION PIPE LOOP AND BACKLIGHT MODULE USING SAME

BACKGROUND OF THE INVENTION

1. Field of the Invention

The present invention relates to the field of heat dissipation, and in particular to a heat dissipation pipe loop and a backlight module using the heat dissipation pipe loop.

2. The Related Arts

Liquid crystal displays (LCDs) have a variety of advantages, such as thin device body, low power consumption, and being free of radiation, and are thus of wide applications. Most of the liquid crystal displays that are currently available in the market are backlighting liquid crystal displays, which comprise a liquid crystal display panel and a backlight module. The operation principle of the liquid crystal display panel is that, with liquid crystal molecules interposed between two parallel glass substrates, a plurality of vertical and horizontal tiny wires is arranged between the two glass substrates and application of electricity is selectively made to control the liquid crystal molecules to change direction in order to refract out light emitting from the backlight module for generating images. Since the liquid crystal display panel itself does not emit light, light must be provided by the backlight module in order to normally display images. Thus, the backlight module is one of the key components of a liquid crystal display. The backlight modules can be classified in two types, namely a side-edge backlight module and a direct backlight module, according to the position where light gets incident. The direct backlight module comprises a light emission source, which is arranged at the backside of the liquid crystal display panel to form a planar light source directly supplied to the liquid crystal display panel. The side-edge backlight module comprises a light emission source, which is arranged at an edge of a backplane to be located rearward of one side of the liquid crystal display panel. The light emitting from the light emission source enters a light guide plate (LGP) through a light incident face at one side of the light guide plate and is projected out of a light exit face of the light guide plate, after being reflected and diffused, to pass through an optic film assembly to form a planar light source for the liquid crystal display panel.

Heretofore, commonly used light emission sources include a cold cathode fluorescent lamp (CCFL), an external electrode fluorescent lamp (EEFL), and a light-emitting diode (LED), among which the LED is advantageous in respect of environmental conservation and extended life span and is thus widely used. A heat dissipation device that is provided for dissipation of heat from the LED is a vital part for the purposes of preventing the backlight module from getting deteriorated and extending the life span of the backlight module.

In the state of the art, it is common to arrange a heat dissipation pipe loop under a printed circuit board (PCB) on which a plurality of LED lights is mounted in order to achieve heat dissipation of the LED lights.

Referring to FIG. 1, a schematic view is given to show a conventional LED heat dissipation pipe loop, which comprises a liquid pipe 100, an evaporator section 300, a gas pipe 500, and a condenser pipe 700. The heat dissipation pipe loop is filled with a heat dissipation liquid (including water, Freon refrigerant, ammonia, and methanol) that can readily evaporate through absorption of heat. The heat dissipation liquid passes through the liquid pipe 100 into the evaporator section 300 to absorb heat and evaporate into a gas that enters the gas pipe 500 and passes through the condenser pipe 700 to get condensed into liquid for entering the liquid pipe 100 against. This cycle is repeated to enhance the heat dissipation effect.

Further, referring to FIG. 3, the evaporator section 300 comprises an evaporation surface 302, a capillary structure 304, a gas passage 306, a blocking plate 307, a compensation chamber 308, and a liquid phase chamber 309. The heat dissipation pipe loop is an alloy pipe made of metals, such as copper and titanium and a working liquid (including water, Freon refrigerant, ammonia, and methanol) is filled, in a proper amount, into the alloy pipe in a vacuum environment. The working liquid can absorb heat and evaporate into gas.

Referring to FIGS. 2 and 3, an LED module generally comprises LED units 902 and a PCB 904. To achieve heat dissipation, the PCB 904 is positioned on the evaporation surface 302 of the evaporator section 300. The working liquid flows from the liquid pipe 100 into the evaporator section 300 and moves through the liquid phase chamber 309 and the capillary structure 304 in sequence to absorb the heat from an external heat source and convert into gas. The working liquid that has been evaporated into gas passes through the gas passage 306 to flow into the gas pipe 500 to then pass through the condenser pipe 700 for being condensed back into liquid to be cyclically circulated and used in the heat dissipation pipe loop.

It is can be seen from the principle of heat dissipation of the heat dissipation pipe loop that there are both liquid and gas existing in the evaporator section 300. However, it is can be seen from FIG. 3 that the evaporator section 300 of the heat dissipation pipe loop uses the capillary structure 304 and the blocking plate 307 to separate the liquid and the gas from each other. In such a structure, the flow passage of gas is extremely narrow so that the performance of separation of gas and liquid is poor. However, the performance of separation of gas and liquid directly affects the flow speeds of the gas and the liquid and thus affecting the performance of heat dissipation of the heat dissipation pipe loop.

SUMMARY OF THE INVENTION

An object of the present invention is to provide a heat dissipation pipe loop that has a simple structure, a low cost, and an excellent effect of heat dissipation.

Another object of the present invention is to provide a backlight module, which comprises a heat dissipation pipe loop arranged between a backlight source and a backplane in order to enhance the effect of heat dissipation and thus securing the quality of the backlight module.

To achieve the above objects, the present invention provides a heat dissipation pipe loop, which comprises: an evaporator section, a liquid pipe connected to an end of the evaporator section, a condenser pipe connected to an end of the liquid pipe distant from the evaporator section, and a gas pipe having an end connected to the condenser pipe and an opposite end connected to the evaporator section. The evaporator section includes an enclosure and a separation board received in the enclosure. The enclosure defines therein a receiving space. The separation board is mounted in the receiving space to divide the receiving space into a liquid chamber and a gas chamber. The liquid pipe is in communication with the liquid chamber and the gas pipe is in communication with the gas chamber. The separation board separates liquid and gas from each other.

The enclosure comprises a bottom board, a top board opposite to the bottom board, and a plurality of side boards connected between the bottom board and the top board. The bottom board, the top board, and the side boards delimit the receiving space.

The separation board has an end positioned against the bottom board and an opposite positioned against the top board and the separation board is positioned against the top board at an end thereof adjacent to the gas pipe, whereby the receiving space is divided into the liquid chamber that is located in a left portion and the gas chamber that is located in a right portion.

The separation board is arranged between and parallel to the bottom board and the top board to divide the receiving space in the liquid chamber that is located in a top portion and the gas chamber that is located in a bottom portion.

The separation board is made of a high-molecular polymer material.

The present invention also provides a heat dissipation pipe loop, which comprises: an evaporator section, a liquid pipe connected to an end of the evaporator section, a condenser pipe connected to an end of the liquid pipe distant from the evaporator section, and a gas pipe having an end connected to the condenser pipe and an opposite end connected to the evaporator section, the evaporator section comprising an enclosure and a separation board received in the enclosure, the enclosure defining therein a receiving space, the separation board being mounted in the receiving space to divide the receiving space into a liquid chamber and a gas chamber, the liquid pipe being in communication with the liquid chamber, the gas pipe being in communication with the gas chamber, the separation board separating liquid and gas from each other;

wherein the enclosure comprises a bottom board, a top board opposite to the bottom board, and a plurality of side boards connected between the bottom board and the top board, the bottom board, the top board, and the side boards delimiting the receiving space.

The separation board has an end positioned against the bottom board and an opposite positioned against the top board and the separation board is positioned against the top board at an end thereof adjacent to the gas pipe, whereby the receiving space is divided into the liquid chamber that is located in a left portion and the gas chamber that is located in a right portion.

The separation board is arranged between and parallel to the bottom board and the top board to divide the receiving space in the liquid chamber that is located in a top portion and the gas chamber that is located in a bottom portion.

The separation board is made of a high-molecular polymer material.

The present invention further provides a backlight module, which comprises: a backplane, a backlight source arranged in the backplane, a light guide plate arranged in the backplane, and a heat dissipation pipe loop arranged in the backplane and located under the backlight source. The heat dissipation pipe loop comprises: an evaporator section, a liquid pipe connected to an end of the evaporator section, a condenser pipe connected to an end of the liquid pipe distant from the evaporator section, and a gas pipe having an end connected to the condenser pipe and an opposite end connected to the evaporator section. The evaporator section includes an enclosure and a separation board received in the enclosure. The enclosure defines therein a receiving space, the separation board being mounted in the receiving space to divide the receiving space into a liquid chamber and a gas chamber. The liquid pipe is in communication with the liquid chamber. The gas pipe is in communication with the gas chamber. The separation board separates liquid and gas from each other.

The enclosure comprises a bottom board, a top board opposite to the bottom board, and a plurality of side boards connected between the bottom board and the top board. The bottom board, the top board, and the side boards delimit the receiving space. The backlight source is arranged on the top board.

The separation board has an end positioned against the bottom board and an opposite positioned against the top board and the separation board is positioned against the top board at an end thereof adjacent to the gas pipe, whereby the receiving space is divided into the liquid chamber that is located in a left portion and the gas chamber that is located in a right portion.

The separation board is arranged between and parallel to the bottom board and the top board to divide the receiving space in the liquid chamber that is located in a top portion and the gas chamber that is located in a bottom portion.

The separation board is made of a high-molecular polymer material.

The efficacy of the present invention is that the present invention provides a heat dissipation pipe loop and a backlight module using the dissipation pipe loop, in which a separation board is arranged inside an evaporator section to achieve separation of gas and liquid with a simple structure so as to effectively simplify the structure of the heat dissipation pipe loop, reduce the manufacturing cost of the heat dissipation pipe loop, enhance the performance of separation of liquid and gas, increase the flow speeds of liquid and gas, enhance the heat dissipation performance of the heat dissipation pipe loop, and thus enhance the heat dissipation performance of the backlight module.

For better understanding of the features and technical contents of the present invention, reference will be made to the following detailed description of the present invention and the attached drawings. However, the drawings are provided for the purposes of reference and illustration and are not intended to impose limitations to the present invention.

BRIEF DESCRIPTION OF THE DRAWINGS

The technical solution, as well as other beneficial advantages, of the present invention will be apparent from the following detailed description of embodiments of the present invention, with reference to the attached drawing. In the drawing.

DETAILED DESCRIPTION OF THE PREFERRED EMBODIMENTS

To further expound the technical solution adopted in the present invention and the advantages thereof, a detailed description is given to a preferred embodiment of the present invention and the attached drawings.

Figure 1:
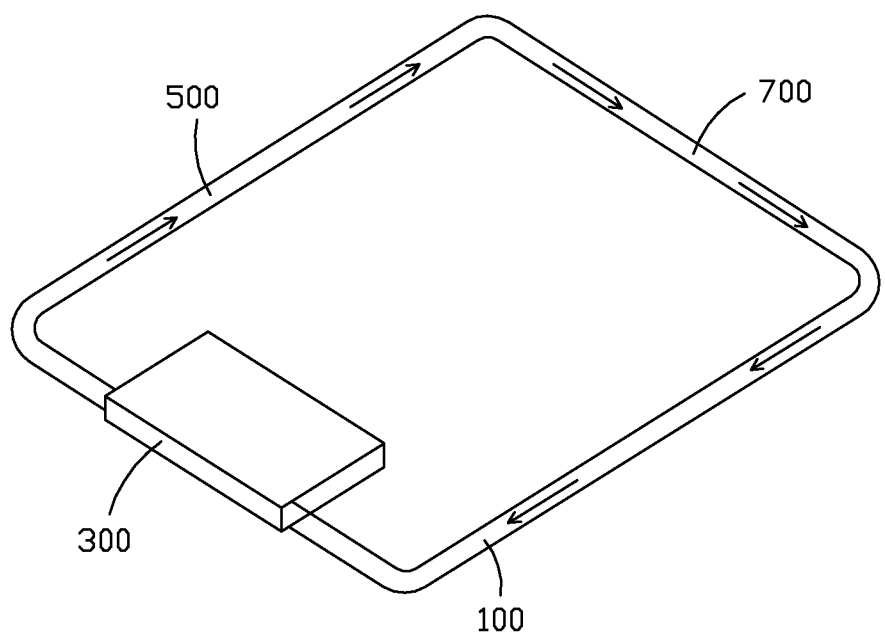
FIG. 1 is a schematic view showing a conventional heat dissipation pipe loop.
Figure 2:
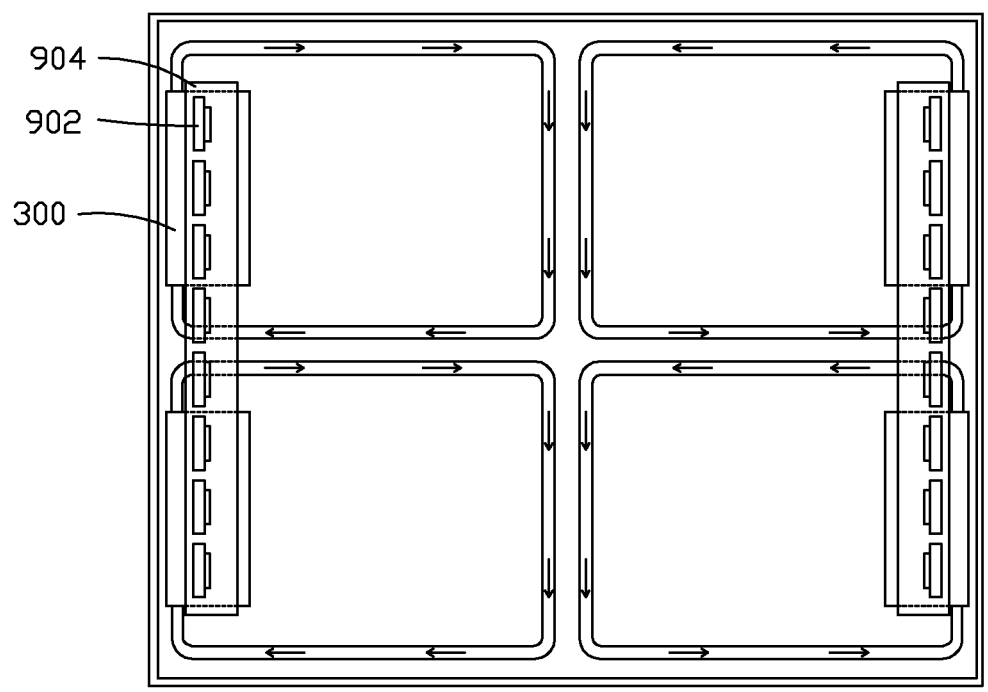
FIG. 2 is a schematic view showing heat dissipation pipe loops mounted to a backplane.
Figure 3:
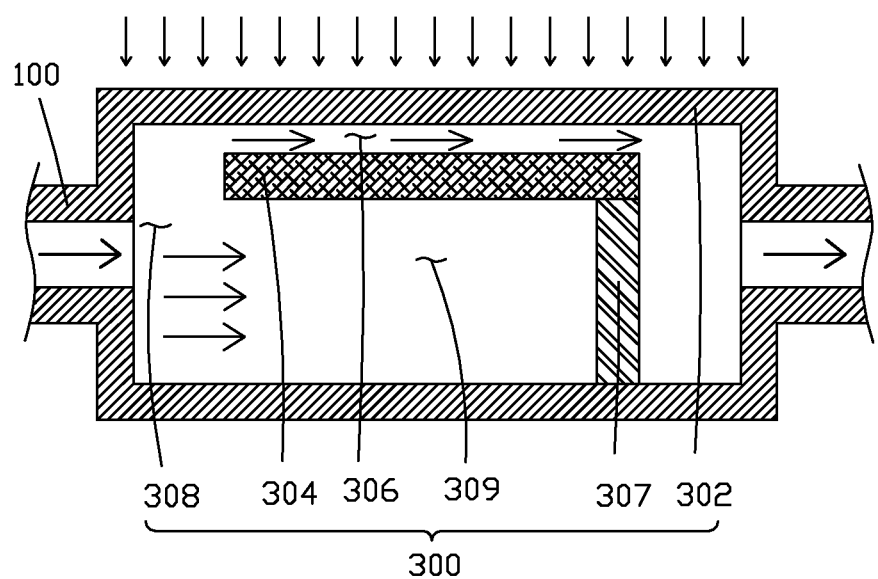
FIG. 3 is a schematic view showing a cross section of an evaporator section of FIG. 1.
Figure 4:
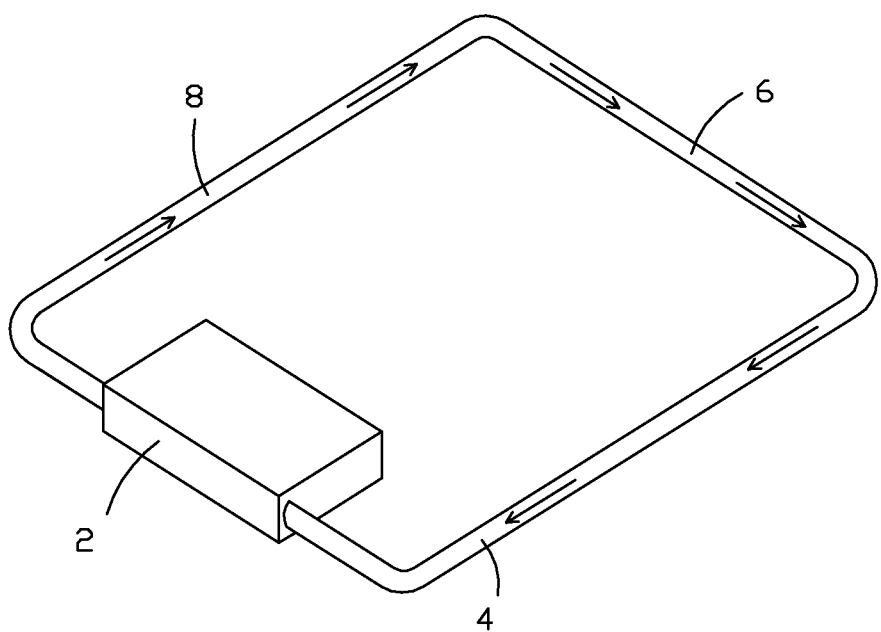
FIG. 4 is a schematic view showing a heat dissipation pipe loop according to a first embodiment of the present invention.
Figure 5:
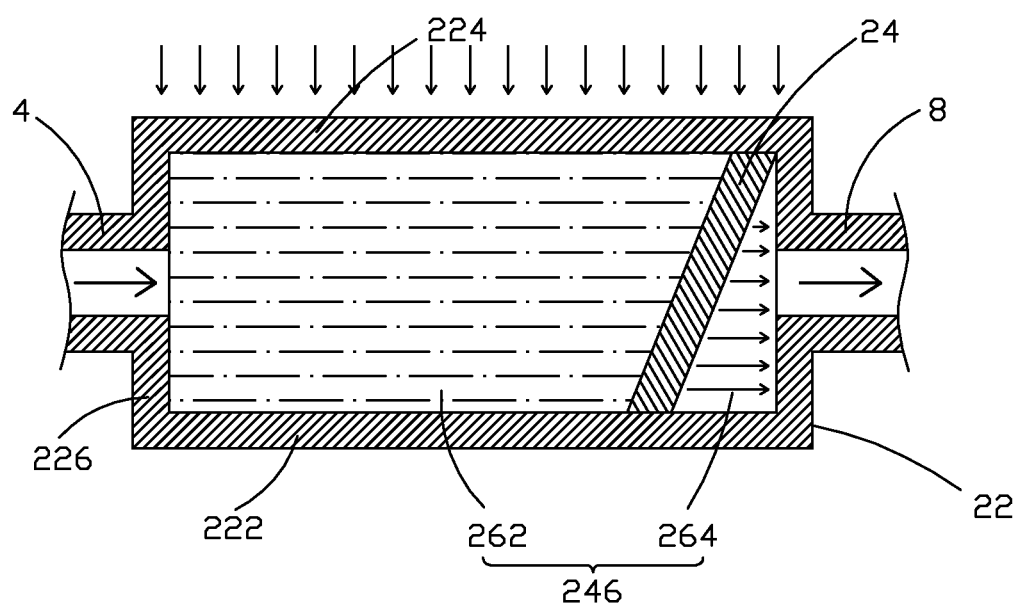
FIG. 5 is a schematic view showing a cross section of an evaporator section of FIG. 4.

Referring to FIGS. 4 and 5, the present invention provides a heat dissipation pipe loop, which comprises: an evaporator section 2, a liquid pipe 4 connected to an end of the evaporator section 2, a condenser pipe 6 connected to an end of the liquid pipe 4 distant from the evaporator section 2, and a gas pipe 8 having an end connected to the condenser pipe 6 and an opposite end connected to the evaporator section 2. The evaporator section 2 comprises an enclosure 22 and a separation board 24 received in the enclosure 22. The enclosure 22 defines therein a receiving space 246 and the separation board 24 is mounted in the receiving space 246 to divide the receiving space 246 into a liquid chamber 262 and a gas chamber 264. The liquid pipe 4 is in communication with the liquid chamber 262 and the gas pipe 8 is in communication with the gas chamber 264. The separation board 24 is made of a high-molecular polymer material for separating liquid and gas from each other. With the separation board 24, liquid and gas inside the evaporator section 2 are separated. Compared to an existing evaporator section, the present invention can effectively simplify the structure of the evaporator section 2, reduce the manufacturing cost of the evaporator section 2, and thus reduce the manufacturing cost of the entire heat dissipation pipe loop.

The liquid mentioned above is a coolant liquid, which is filled in the pipe during the manufacture of the heat dissipation pipe loop. The evaporator section 2 may absorb heat and transfers the heat to the coolant liquid inside the liquid chamber 262, whereby the coolant liquid absorbs the heat and converts into gas. The gas passes through the separation board 24 and enters the gas chamber 264 and then moves through the gas pipe 8 to the condenser pipe 6. The gas is condensed back to liquid in the condenser pipe 6 and moves through the liquid pipe 4 to the liquid chamber 262. This circulation cyclically proceeds in order to achieve dissipation of heat.

Specifically, referring to FIG. 5, the enclosure 22 comprises a bottom board 222, a top board 224 opposite to the bottom board 222, and a plurality of side boards 226 connected between the bottom board 222 and the top board 224. The bottom board 222, the top board 224, and the side boards 226 delimit the receiving space 246. The top board 224 has an upper surface that serves as a heat dissipation surface, whereby a device from which heat is to be dissipated is placed tightly against the dissipation surface in order to achieve transfer of heat to the liquid chamber 262.

Referring to FIG. 5, in the instant embodiment, the separation board 24 is mounted in an inclined manner in the receiving space 246 with one end positioned against the bottom board 222 and an opposite end positioned against the top board 224 so as to divide the receiving space 246 in to a liquid chamber 262 that is located in the left portion and a gas chamber 264 that is located in the right portion. Specifically, the separation board 24 is positioned against the top board 224 at an end thereof adjacent to the gas pipe 8 in order to maximize the contact area between the liquid chamber 262 and the heat dissipation surface thereby enhancing to the effect of heat dissipation to the greatest extent and the end thereof positioned against the bottom board 222 can be arranged according to a practical requirement of heat dissipation and a desired effect of liquid/gas separation of the separation board 24, all these being effective in achieving the technical performance of the present invention.

Figure 6:
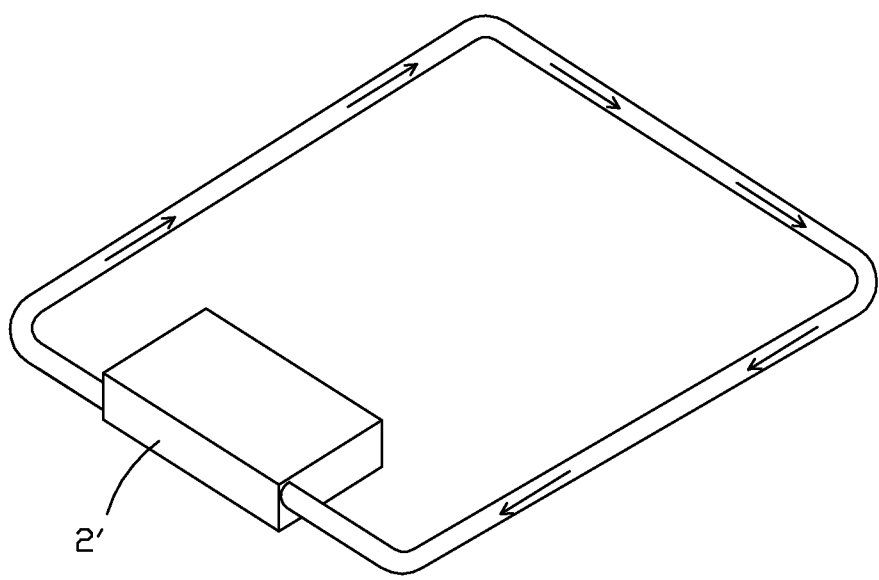
FIG. 6 is a schematic view showing a heat dissipation pipe loop according to a second embodiment of the present invention.

Referring to FIG. 6, which is a schematic view showing a heat dissipation pipe loop according to a second embodiment of the present invention, in the instant embodiment, the liquid pipe 4 and the gas pipe 8 are connected to opposite ends of the evaporator section 2' in a staggered manner. More specifically, referring to FIG. 7, the separation board 24' is arranged between and parallel to the bottom board 222 and the top board 224 in order to divide the receiving space 246 in to a liquid chamber 262' that is located in a top portion and a gas chamber 264' that is located in a bottom portion. This can similarly achieves the technical performance of the present invention.

Figure 8:
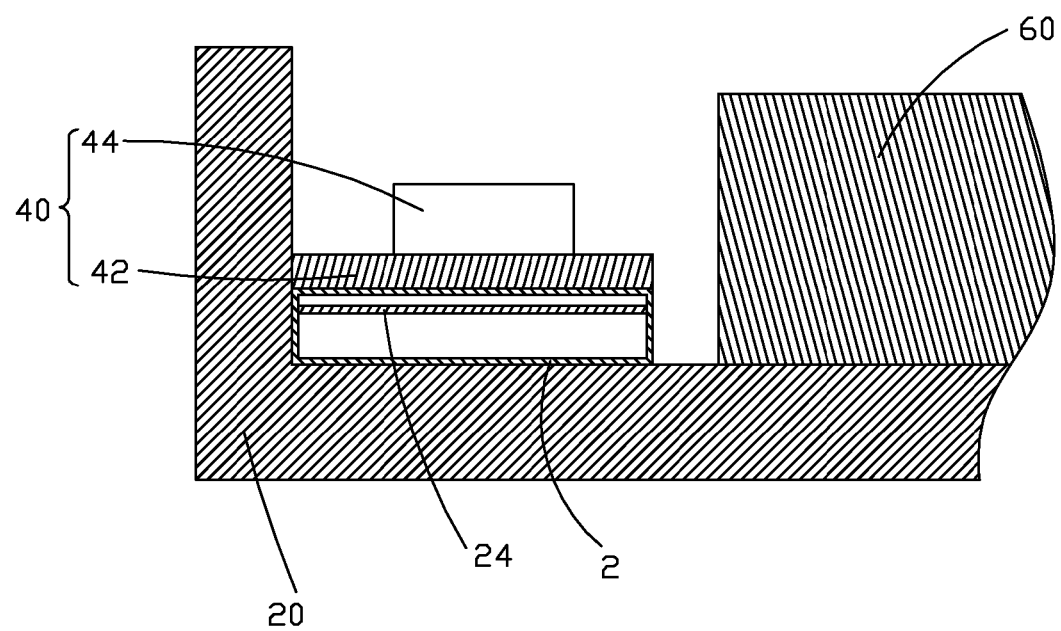
FIG. 8 is a schematic view showing the structure of a backlight module according to the present invention.

Referring to FIG. 8, with additional reference to FIGS. 4 and 5, the present invention provides a backlight module, which comprises: a backplane 20, a backlight source 40 arranged in the backplane 20, a light guide plate 60 arranged in the backplane 20, and a heat dissipation pipe loop arranged in the backplane 20 and located under the backlight source 40. The heat dissipation pipe loop comprises: an evaporator section 2, a liquid pipe 4 connected to an end of the evaporator section 2, a condenser pipe 6 connected to an end of the liquid pipe 4 distant from the evaporator section 2, and a gas pipe 8 having an end connected to the condenser pipe 6 and an opposite end connected to the evaporator section 2. The evaporator section 2 comprises an enclosure 22 and a separation board 24 received in the enclosure 22. The enclosure 22 defines therein a receiving space 246 and the separation board 24 is mounted in the receiving space 246 to divide the receiving space 246 into a liquid chamber 262 and a gas chamber 264. The liquid pipe 4 is in communication with the liquid chamber 262 and the gas pipe 8 is in communication with the gas chamber 264. The separation board 24 is made of a high-molecular polymer material for separating liquid and gas from each other. With the separation board 24, liquid and gas inside the evaporator section 2 are separated. Compared to an existing evaporator section, the present invention can effectively simplify the structure of the evaporator section 2, reduce the manufacturing cost of the evaporator section 2, and thus reduce the manufacturing cost of the entire heat dissipation pipe loop.

The liquid mentioned above is a coolant liquid, which is filled in the pipe during the manufacture of the heat dissipation pipe loop. The evaporator section 2 may absorb heat from the backlight source 40 and transfers the heat to the coolant liquid inside the liquid chamber 262, whereby the coolant liquid absorbs the heat and converts into gas. The gas passes through the separation board 24 and enters the gas chamber 264 and then moves through the gas pipe 8 to the condenser pipe 6. The gas is condensed back to liquid in the condenser pipe 6 and moves through the liquid pipe 4 to the liquid chamber 262. This circulation cyclically proceeds in order to achieve dissipation of heat.

Specifically, referring to FIG. 5, the enclosure 22 comprises a bottom board 222, a top board 224 opposite to the bottom board 222, and a plurality of side boards 226 connected between the bottom board 222 and the top board 224. The bottom board 222, the top board 224, and the side boards 226 delimit the receiving space 246. The top board 224 has an upper surface that serves as a heat dissipation surface and a circuit board 42 of the backlight source 40 is placed tightly against the dissipation surface in order to transfer heat from an LED light 44 to the liquid chamber 262 and thus secure the quality of the backlight module.

Referring to FIG. 5, in the instant embodiment, the separation board 24 is mounted in an inclined manner in the receiving space 246 with one end positioned against the bottom board 222 and an opposite end positioned against the top board 224 so as to divide the receiving space 246 in to a liquid chamber 262 that is located in the left portion and a gas chamber 264 that is located in the right portion. Specifically, the separation board 24 is positioned against the top board 224 at an end thereof adjacent to the gas pipe 8 in order to maximize the contact area between the liquid chamber 262 and the heat dissipation surface thereby enhancing to the effect of heat dissipation to the greatest extent and the end thereof positioned against the bottom board 222 can be arranged according to a practical requirement of heat dissipation and a desired effect of liquid/gas separation of the separation board 24, all these being effective in achieving the technical performance of the present invention.

Figure 7:
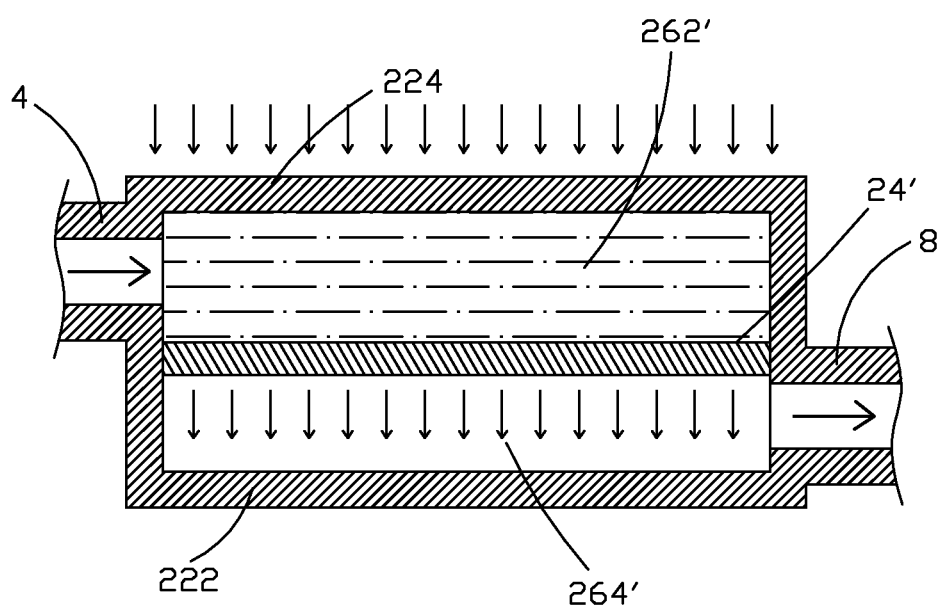
FIG. 7 is a schematic view showing a cross section of an evaporator section of FIG. 6.
Figure 9:
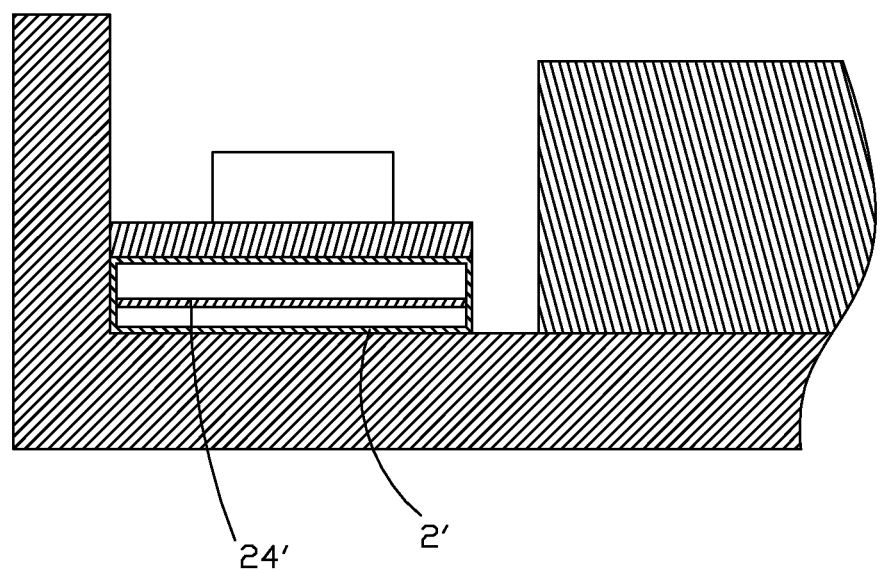
FIG. 9 is a schematic view showing the structure of a backlight module according to another embodiment of the present invention.

Referring to FIG. 9, with additional reference to FIGS. 6 and 7, which is a schematic view showing a backlight module according to another embodiment of the present invention, in the instant embodiment, the liquid pipe 4 and the gas pipe 8 are connected to opposite ends of the evaporator section 2' in a staggered manner and the separation board 24' is arranged between and parallel to the bottom board 222 and the top board 224 in order to divide the receiving space 246 in to a liquid chamber 262' that is located in a top portion and a gas chamber 264' that is located in a bottom portion. This can similarly achieves the technical performance of the present invention.

In summary, the present invention provides a heat dissipation pipe loop and a backlight module using the dissipation pipe loop, in which a separation board is arranged inside an evaporator section to achieve separation of gas and liquid with a simple structure so as to effectively simplify the structure of the heat dissipation pipe loop, reduce the manufacturing cost of the heat dissipation pipe loop, enhance the performance of separation of liquid and gas, increase the flow speeds of liquid and gas, enhance the heat dissipation performance of the heat dissipation pipe loop, and thus enhance the heat dissipation performance of the backlight module.

Based on the description given above, those having ordinary skills of the art may easily contemplate various changes and modifications of the technical solution and technical ideas of the present invention and all these changes and modifications are considered within the protection scope of right for the present invention.

What is claimed is:

1. A heat dissipation pipe loop, comprising: an evaporator section, a liquid pipe connected to an end of the evaporator section at an upstream side of the evaporator section, a condenser pipe connected to an end of the liquid pipe distant from the evaporator section, and a gas pipe having an end connected to the condenser pipe and an opposite end connected to the evaporator section at a downstream side of the evaporator section, the evaporator section comprising an enclosure and a separation board received in the enclosure, the enclosure defining therein a receiving space, the separation board being mounted in the receiving space to divide the receiving space into a liquid chamber and a gas chamber, the liquid pipe being in communication with the liquid chamber such that liquid flowing along the liquid pipe is received from the upstream side into the liquid chamber of the evaporator section, the gas pipe being in communication with the gas chamber such that gas flows out of the gas chamber and into the gas pipe to move toward the downstream side, the separation board separating the liquid received in the liquid chamber and the gas contained in the gas chamber from each other;

wherein the enclosure comprises a top board adapted to receive an external heat source to be positioned thereon and in direct contact therewith, the liquid received in the liquid chamber being in direct contact with the top board substantially in the entirety thereof to maximize heat transfer from the external heat source to the liquid to evaporate the liquid into gas that moves through the separation board into the gas chamber; and wherein the separation board that is mounted in the receiving space constrains the liquid in the liquid chamber from further movement toward the downstream side.

2. The heat dissipation pipe loop as claimed in claim 1, wherein the enclosure comprises a bottom board, which is opposite to the top board, and a plurality of side boards connected between the bottom board and the top board, the bottom board, the top board, and the side boards delimiting the receiving space.

3. The heat dissipation pipe loop as claimed in claim 2, wherein the separation board has an end positioned against the bottom board and an opposite positioned against the top board, the separation board being positioned against the top board at an end thereof adjacent to the gas pipe, whereby the receiving space is divided into the liquid chamber that is located in a left portion and the gas chamber that is located in a right portion.

4. The heat dissipation pipe loop as claimed in claim 2, wherein the separation board is arranged between and parallel to the bottom board and the top board to divide the receiving space in the liquid chamber that is located in a top portion and the gas chamber that is located in a bottom portion.

5. The heat dissipation pipe loop as claimed in claim 1, wherein the separation board is made of a high-molecular polymer material.

6. A heat dissipation pipe loop, comprising: an evaporator section, a liquid pipe connected to an end of the evaporator section at an upstream side of the evaporator section, a condenser pipe connected to an end of the liquid pipe distant from the evaporator section, and a gas pipe having an end connected to the condenser pipe and an opposite end connected to the evaporator section at a downstream side of the evaporator section, the evaporator section comprising an enclosure and a separation board received in the enclosure, the enclosure defining therein a receiving space, the separation board being mounted in the receiving space to divide the receiving space into a liquid chamber and a gas chamber, the liquid pipe being in communication with the liquid chamber such that liquid flowing along the liquid pipe is received from the upstream side into the liquid chamber of the evaporator section, the gas pipe being in communication with the gas chamber such that gas flows out of the gas chamber and into the gas pipe to move toward the downstream side, the separation board separating the liquid received in the liquid chamber and the gas contained in the gas chamber from each other;

wherein the enclosure comprises a top board adapted to receive an external heat source to be positioned thereon and in direct contact therewith, the liquid received in the liquid chamber being in direct contact with the top board substantially in the entirety thereof to maximize heat transfer from the external heat source to the liquid to evaporate the liquid into gas that moves through the separation board into the gas chamber;

wherein the enclosure comprises a bottom board, which is opposite to the top board, and a plurality of side boards connected between the bottom board and the top board, the bottom board, the top board, and the side boards delimiting the receiving space; and wherein the separation board that is mounted in the receiving space constrains the liquid in the liquid chamber from further movement toward the downstream side.

7. The heat dissipation pipe loop as claimed in claim 6, wherein the separation board has an end positioned against the bottom board and an opposite positioned against the top board, the separation board being positioned against the top board at an end thereof adjacent to the gas pipe, whereby the receiving space is divided into the liquid chamber that is located in a left portion and the gas chamber that is located in a right portion.

8. The heat dissipation pipe loop as claimed in claim 6, wherein the separation board is arranged between and parallel to the bottom board and the top board to divide the receiving space in the liquid chamber that is located in a top portion and the gas chamber that is located in a bottom portion.

9. The heat dissipation pipe loop as claimed in claim 6, wherein the separation board is made of a high-molecular polymer material.

10. A backlight module, comprising: a backplane, a backlight source arranged in the backplane, a light guide plate arranged in the backplane, and a heat dissipation pipe loop arranged in the backplane and located under the backlight source, the heat dissipation pipe loop comprising: an evaporator section, a liquid pipe connected to an end of the evaporator section at an upstream side of the evaporator section, a condenser pipe connected to an end of the liquid pipe distant from the evaporator section, and a gas pipe having an end connected to the condenser pipe and an opposite end connected to the evaporator section at a downstream side of the evaporator section, the evaporator section comprising an enclosure and a separation board received in the enclosure, the enclosure defining therein a receiving space, the separation board being mounted in the receiving space to divide the receiving space into a liquid chamber and a gas chamber, the liquid pipe being in communication with the liquid chamber such that liquid flowing along the liquid pipe is received from the upstream side into the liquid chamber of the evaporator section, the gas pipe being in communication with the gas chamber such that gas flows out of the gas chamber and into the gas pipe to move toward the downstream side, the separation board separating the liquid received in the liquid chamber and the gas contained in the gas chamber from each other;

wherein the enclosure comprises a top board adapted to receive an external heat source to be positioned thereon and in direct contact therewith, the liquid received in the liquid chamber being in direct contact with the top board substantially in the entirety thereof to maximize heat transfer from the external heat source to the liquid to evaporate the liquid into gas that moves through the separation board into the gas chamber; and wherein the separation board that is mounted in the receiving space constrains the liquid in the liquid chamber from further movement toward the downstream side.

11. The backlight module as claimed in claim 10, wherein the enclosure comprises a bottom board, which is opposite to the top board, and a plurality of side boards connected between the bottom board and the top board, the bottom board, the top board, and the side boards delimiting the receiving space, the backlight source being arranged on the top board.

12. The backlight module as claimed in claim 11, wherein the separation board has an end positioned against the bottom board and an opposite positioned against the top board, the separation board being positioned against the top board at an end thereof adjacent to the gas pipe, whereby the receiving space is divided into the liquid chamber that is located in a left portion and the gas chamber that is located in a right portion.

13. The backlight module as claimed in claim 11, wherein the separation board is arranged between and parallel to the bottom board and the top board to divide the receiving space in the liquid chamber that is located in a top portion and the gas chamber that is located in a bottom portion.

14. The backlight module as claimed in claim 10, wherein the separation board is made of a high-molecular polymer material.

* * * * *